US012287550B2

United States Patent
Hu

(10) Patent No.: US 12,287,550 B2
(45) Date of Patent: Apr. 29, 2025

(54) ARRAY SUBSTRATE AND DISPLAY PANEL

(71) Applicant: Guangzhou China Star Optoelectronics Semiconductor Display Technology Co., LTD., Guangdong (CN)

(72) Inventor: Xiaobin Hu, Guangdong (CN)

(73) Assignee: Guangzhou China Star Optoelectronics Semiconductor Display Technology Co., LTD., Guangzhou (CN)

( * ) Notice: Subject to any disclaimer, the term of this patent is extended or adjusted under 35 U.S.C. 154(b) by 0 days.

(21) Appl. No.: 17/781,100

(22) PCT Filed: May 13, 2022

(86) PCT No.: PCT/CN2022/092788
§ 371 (c)(1),
(2) Date: May 31, 2022

(87) PCT Pub. No.: WO2023/206628
PCT Pub. Date: Nov. 2, 2023

(65) Prior Publication Data
US 2024/0184172 A1    Jun. 6, 2024

(30) Foreign Application Priority Data
Apr. 25, 2022    (CN) .......................... 202210443252.6

(51) Int. Cl.
*G02F 1/1362*    (2006.01)
*G02F 1/1368*    (2006.01)
(Continued)

(52) U.S. Cl.
CPC .. *G02F 1/136213* (2013.01); *G02F 1/136227* (2013.01); *G02F 1/1368* (2013.01);
(Continued)

(58) Field of Classification Search
CPC ......... G02F 1/136213; G02F 1/136227; G02F 1/1368; G02F 1/134372; H01L 27/124;
(Continued)

(56) References Cited

U.S. PATENT DOCUMENTS

2002/0117719 A1    8/2002  Ando
2016/0291758 A1*  10/2016  Du ...................... G06F 3/04164
2017/0052414 A1    2/2017  Cheng et al.

FOREIGN PATENT DOCUMENTS

| CN | 103777418 | 5/2014 |
|---|---|---|
| CN | 104699316 | 6/2015 |

(Continued)

OTHER PUBLICATIONS

International Search Report and the Written Opinion Dated Nov. 25, 2022 From the International Searching Authority Re. Application No. PCT/CN2022/092788 and Its Translation Into English. (17 Pages).

(Continued)

*Primary Examiner* — James A Dudek

(57) ABSTRACT

The present application provides an array substrate and a display panel. By arranging an auxiliary electrode in a second electrode layer that is in a different layer from the pixel electrode, an aperture ratio of a pixel can be increased. In addition to that, a capacity of the storage capacitor can be increased, thereby solving a problem that the display panel is prone to flickering.

12 Claims, 4 Drawing Sheets

(51) Int. Cl.
*H10D 86/40* (2025.01)
*H10D 86/60* (2025.01)

(52) U.S. Cl.
CPC ......... *H10D 86/441* (2025.01); *H10D 86/481* (2025.01); *H10D 86/60* (2025.01)

(58) Field of Classification Search
CPC .............. H01L 27/1255; H10D 86/441; H10D 86/481; H10D 86/60
See application file for complete search history.

(56) References Cited

FOREIGN PATENT DOCUMENTS

| | | |
|---|---|---|
| CN | 104813386 | 7/2015 |
| CN | 107991796 | 5/2018 |
| CN | 111965908 | 11/2020 |
| CN | 213750597 | 7/2021 |
| JP | 2001-331124 | 11/2001 |
| JP | 2007-121793 | 5/2007 |

OTHER PUBLICATIONS

Notification of Office Action and Search Report Dated Apr. 22, 2023 From The State Intellectual Property Office of the People's Republic of China Re. Application No. 202210443252.6 and Its Translation Into English. (16 Pages).

* cited by examiner

ARRAY SUBSTRATE AND DISPLAY PANEL

RELATED APPLICATIONS

This application is a National Phase of PCT Patent Application No. PCT/CN2022/092788 having International filing date of May 13, 2022, which claims the benefit of priority of Chinese Patent Application No. 202210443252.6 filed on Apr. 25, 2022. The contents of the above applications are all incorporated by reference as if fully set forth herein in their entirety.

FIELD AND BACKGROUND OF THE INVENTION

The present application relates to a field of display technology and in particular, to an array substrate and a display panel.

Conventional liquid crystal displays generally include a liquid crystal display panel and a backlight module. The liquid crystal display panel is usually composed of a color filter substrate, a thin film transistor array substrate, and a liquid crystal layer disposed between the two substrates. Its working principle is to control rotation of liquid crystal molecules of the liquid crystal layer by applying a driving voltage, and refract the light from the backlight module to generate images.

Thin film transistor liquid crystal display panels have a wide range of applications due to their advantages of lightness, environmental protection, and high performance. In recent years, in order to simplify a manufacturing process of thin film transistor liquid crystal display panels and reduce production costs, the application of four-mask process technology has become more and more common. However, in conventional display panels manufactured by the four-mask process technology, the common electrode generally forms a storage capacitor with the pixel electrode. Since the common electrode has a larger area, the common electrode also has higher resistance. In order to reduce the resistance of the common electrode, the prior art is usually provided with an auxiliary electrode connected in parallel with the common electrode, and the auxiliary electrode is arranged in the same layer as the pixel electrode, which reduces an aperture ratio of the pixels of the display panel and generally causes a smaller capacitance of the storage capacitor. As a result, the display panel is prone to flickering.

SUMMARY OF THE INVENTION

The present application provides an array substrate and a display panel to improve an aperture ratio of the display panel.

The present application provides an array substrate, comprising:
  a base substrate;
  a first electrode layer disposed on the base substrate, wherein the first electrode layer comprises a plurality of pixel electrodes;
  a first insulating layer disposed on the first electrode layer;
  a second electrode layer disposed on the first insulating layer, wherein the second electrode layer comprises a plurality of auxiliary electrodes;
  a second insulating layer disposed on the second electrode layer; and
  a third electrode layer disposed on the second insulating layer, wherein the third electrode layer comprises a plurality of common electrodes;
  wherein an orthographic projection of each of the pixel electrodes projected on the base substrate at least partially overlaps an orthographic projection of one of the common electrodes projected on the base substrate, a plurality of through holes are defined in the second insulating layer, and each of the auxiliary electrodes is connected to one of the common electrodes through at least one of the through holes.

Optionally, in some embodiments of the present application, an orthographic projection of each of the auxiliary electrodes projected on the base substrate at least partially overlaps an orthographic projection of one of the pixel electrodes projected on the base substrate.

Optionally, in some embodiments of the present application, at least two through holes are defined in the second insulating layer, and each of the auxiliary electrodes is connected to one of the common electrodes through the at least two through holes.

Optionally, in some embodiments of the present application, an orthographic projection of a cross-sectional profile of each of the through holes in a thickness direction projected on the base substrate covers an orthographic projection of one of the auxiliary electrodes projected on the base substrate.

Optionally, in some embodiments of the present application, the base substrate comprises a plurality of pixel electrode areas, and the plurality of auxiliary electrodes are disposed in the plurality of pixel electrode areas.

Optionally, in some embodiments of the present application, the array substrate further comprises:
  an active layer disposed on the first insulating layer, wherein the second electrode layer is disposed on the active layer;
  wherein the first electrode layer further comprises a gate electrode, the second electrode layer further comprises a source electrode and a drain electrode, and the source electrode and the drain electrode are connected to the active layer.

Optionally, in some embodiments of the present application, the base substrate comprises multiple pixel electrode areas, the pixel electrode areas are arranged in an array, and the auxiliary electrodes located in the pixel electrode areas in a same row or column are connected in series.

Optionally, in some embodiments of the present application, the second insulating layer is provided with at least one through hole in each of the pixel electrode areas.

Optionally, in some embodiments of the present application, the array substrate further comprises:
  an active layer disposed on the first insulating layer;
  a fourth electrode layer disposed on the active layer; and
  a third insulating layer disposed on the fourth electrode layer, wherein the second electrode layer is disposed on the third insulating layer;
  wherein the first electrode layer further comprises a gate electrode, the fourth electrode layer comprises a source electrode and a drain electrode, and the source electrode and the drain electrode are connected to the active layer.

Optionally, in some embodiments of the present application, the array substrate further comprises:
  an active layer disposed on the second insulating layer;
  a fourth electrode layer disposed on the second insulating layer; and
  a third insulating layer disposed on the fourth electrode layer, wherein the second electrode layer is disposed on the third insulating layer;

wherein the first electrode layer further comprises a gate electrode, the fourth electrode layer comprises a source electrode and a drain electrode, the source electrode and the drain electrode are connected to the active layer, and the plurality of through holes are defined in the second insulating layer and the third insulating layer.

Optionally, in some embodiments of the present application, an orthographic projection of each of the pixel electrodes projected on the base substrate covers an orthographic projection of one of the common electrodes projected on the base substrate.

Accordingly, the present application further provides a display panel, comprising:
an array substrate, a color filter substrate disposed opposite to the array substrate, and a liquid crystal layer located between the array substrate and the color filter substrate, wherein the array substrate comprises:
a base substrate;
a first electrode layer disposed on the base substrate, wherein the first electrode layer comprises a plurality of pixel electrodes;
a first insulating layer disposed on the first electrode layer;
a second electrode layer disposed on the first insulating layer, wherein the second electrode layer comprises a plurality of auxiliary electrodes;
a second insulating layer disposed on the second electrode layer; and
a third electrode layer disposed on the second insulating layer, wherein the third electrode layer comprises a plurality of common electrodes;
wherein an orthographic projection of each of the pixel electrodes projected on the base substrate at least partially overlaps an orthographic projection of one of the common electrodes projected on the base substrate, a plurality of through holes are defined in the second insulating layer, and each of the auxiliary electrodes is connected to one of the common electrodes through at least one of the through holes.

Optionally, in some embodiments of the present application, an orthographic projection of each of the auxiliary electrodes projected on the base substrate at least partially overlaps an orthographic projection of one of the pixel electrodes projected on the base substrate.

Optionally, in some embodiments of the present application, at least two through holes are defined in the second insulating layer, and each of the auxiliary electrodes is connected to one of the common electrodes through the at least two through holes.

Optionally, in some embodiments of the present application, an orthographic projection of a cross-sectional profile of each of the through holes in a thickness direction projected on base the substrate covers an orthographic projection of one of the auxiliary electrodes projected on the base substrate.

Optionally, in some embodiments of the present application, the base substrate comprises a plurality of pixel electrode areas, and the plurality of auxiliary electrodes are disposed in the plurality of pixel electrode areas.

Optionally, in some embodiments of the present application, the array substrate further comprises:
an active layer disposed on the first insulating layer, wherein the second electrode layer is disposed on the active layer;
wherein the first electrode layer further comprises a gate electrode, the second electrode layer further comprises a source electrode and a drain electrode, and the source electrode and the drain electrode are connected to the active layer.

Optionally, in some embodiments of the present application, the base substrate comprises multiple pixel electrode areas, the pixel electrode areas are arranged in an array, and the auxiliary electrodes located in the pixel electrode areas in a same row or column are connected in series.

Optionally, in some embodiments of the present application, the array substrate further comprises:
an active layer disposed on the first insulating layer;
a fourth electrode layer disposed on the active layer; and
a third insulating layer disposed on the fourth electrode layer, wherein the second electrode layer is disposed on the third insulating layer;
wherein the first electrode layer further comprises a gate electrode, the fourth electrode layer comprises a source electrode and a drain electrode, and the source electrode and the drain electrode are connected to the active layer.

Optionally, in some embodiments of the present application, the array substrate further comprises:
an active layer disposed on the second insulating layer;
a fourth electrode layer disposed on the second insulating layer; and
a third insulating layer disposed on the fourth electrode layer, wherein the second electrode layer is disposed on the third insulating layer;
wherein the first electrode layer further comprises a gate electrode, the fourth electrode layer comprises a source electrode and a drain electrode, the source electrode and the drain electrode are connected to the active layer, and the plurality of through holes are defined in the second insulating layer and the third insulating layer.

Optionally, in some embodiments of the present application, an orthographic projection of each of the pixel electrodes projected on the base substrate covers an orthographic projection of one of the common electrodes projected on the base substrate.

Advantages of the Present Application

The present application provides an array substrate and a display panel. The array substrate includes: a base substrate; a first electrode layer, wherein the first electrode layer is disposed on the base substrate, and the first electrode layer includes a plurality of pixel electrodes; a first insulating layer disposed on the first electrode layer; the second electrode layer, wherein the second electrode layer is disposed on the first insulating layer, and the second electrode layer includes a plurality of auxiliary electrodes; a second insulating layer disposed on the second electrode layer; and a third electrode layer disposed on the second insulating layer, wherein the third electrode layer includes a plurality of common electrodes. An orthographic projection of each pixel electrode projected on the base substrate at least partially overlaps an orthographic projection of one common electrode projected on the base substrate. The second insulating layer is provided with a plurality of through holes, and each auxiliary electrode is connected to one of the common electrodes through at least one of the through holes. In the present application, the auxiliary electrodes are arranged in the second electrode layer which is in a different layer from the pixel electrodes, so an aperture ratio of a pixel can be improved. In addition, since a design space of the pixel electrode is increased, a capacity of a storage capacitor can be increased, thereby solving a problem that a conventional display panel is prone to flickering due to a small capacity of a storage capacitor.

DESCRIPTION OF SPECIFIC EMBODIMENTS OF THE INVENTION

Figure 1:
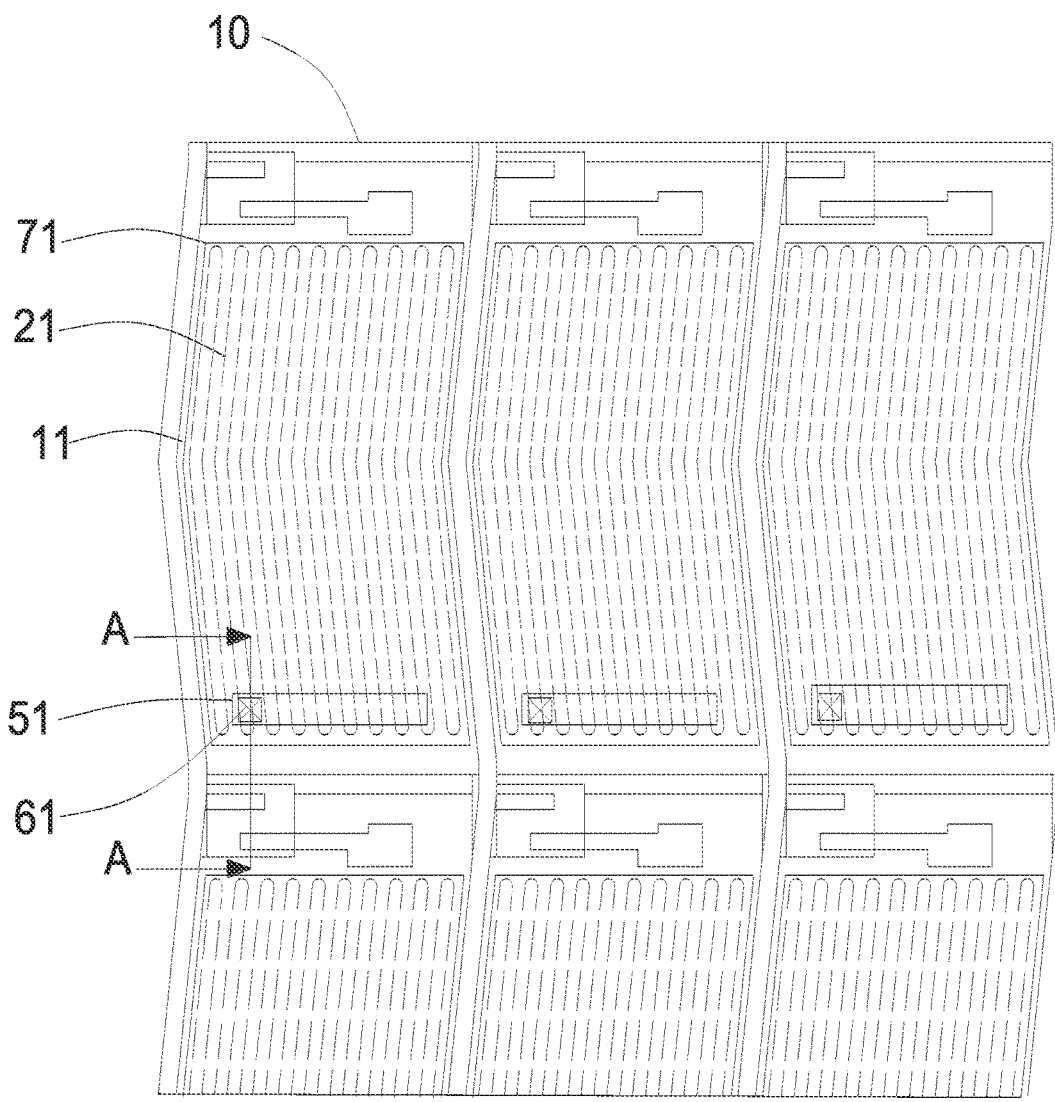
FIG. 1 is a schematic view illustrating an array substrate according to a first embodiment of the present application.

The technical solutions of the present application will be clearly and completely described below with reference to the drawings and in conjunction with the embodiments of the present application. Obviously, the described embodiments are only some of the embodiments of the present application, rather than all the embodiments. Based on the embodiments of the present application, all other embodiments obtained by those skilled in the art without creative work fall within the protection scope of the present application.

In the description of this application, it should be understood that the terms like "center", "length", "width", "upper", "lower", "front", "rear", "left", "right", "inside", and "outside" are based on the direction or positional relationship shown in the drawings, and are only for the convenience of describing the present application and simplifying the description, rather than indicating or implying that the indicated device or element must have a specific orientation or be constructed and operated in a particular orientation. Such terms should not be construed as a limitation to the present application. In addition, the terms "first" and "second" are only used for descriptive purposes, and should not be construed as indicating or implying relative importance or implying the number of indicated technical features. Thus, features defined by "first", "second" can expressly or implicitly include one or more of said features. In the description of the present application, "multiple" means two or more, unless otherwise expressly and specifically defined.

In the specification, a transistor includes at least three terminals, i.e., a gate electrode, a drain electrode, and a source electrode. The transistor has a channel region between the drain electrode (a drain electrode terminal, a drain electrode region, or a drain electrode) and the source electrode (a source electrode terminal, a source electrode region, or a source electrode). An electric current can flow through the drain electrode, the channel region, and the source electrode. Note that in this specification, the channel region refers to a region through which the electric current mainly flows. The functions of the "source electrode" and the "drain electrode" can be interchanged with each other when the transistor is of opposite polarity or when a direction of the electric current changes during circuit operation. Therefore, in this specification, the "source electrode" and the "drain electrode" can be interchanged with each other.

The present application provides an array substrate 100 and a display panel, which are described in detail below. It should be noted that a description order of the following embodiments is not intended to limit a preferred order of the embodiments of the present application.

Figure 2:
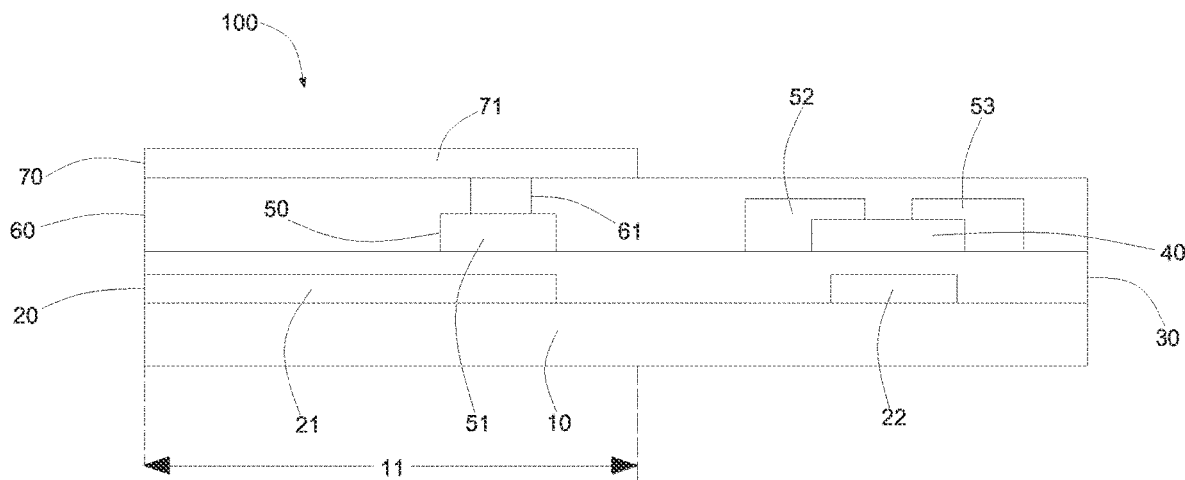
FIG. 2 is a cross-sectional view taken along line A-A in FIG. 1.

Please refer to FIG. 1. FIG. 1 is a schematic view of an array substrate 100 according to a first embodiment of the present application. FIG. 2 is a cross-sectional view taken along line A-A in FIG. 1. The present application provides an array substrate 100 including a base substrate 10, a first electrode layer 20, a first insulating layer 30, a second electrode layer 50, a second insulating layer 60, and a third electrode layer 70.

A material of the base substrate 10 can be selected as required, such as rigid material or a flexible material. In the case where the base substrate 10 is a flexible substrate, the base substrate 10 includes a single flexible organic layer or includes two or more flexible organic layers. A material of the flexible organic layer is selected from a group consisting of one or more of polyimide, polyethylene naphthalate, polyethylene terephthalate, polyarylate, polycarbonate, polyetherimide, or polyethersulfone.

The first electrode layer 20 is disposed on the base substrate 10. The first electrode layer 20 includes a plurality of pixel electrodes 21. The first insulating layer 30 is disposed on the first electrode layer 20. The second electrode layer 50 is disposed on the first insulating layer 30. The second electrode layer 50 includes a plurality of auxiliary electrodes 51. The second insulating layer 60 is disposed on the second electrode layer 50. The third electrode layer 70 is disposed on the second insulating layer 60, and the third electrode layer 70 includes a plurality of common electrodes 71. An orthographic projection of the pixel electrode 21 projected on the base substrate 10 partially overlaps an orthographic projection of the common electrode 71 projected on the base substrate 10. A plurality of through holes 61 is defined in the second insulating layer 60. The auxiliary electrode 51 is connected to the common electrode 71 through the through hole 61.

The first electrode layer 20, the second electrode layer 50, and the third electrode layer 70 can be made of a material or an alloy containing one or more of copper, molybdenum, molybdenum titanium, aluminum, titanium, or nickel.

A storage capacitor is formed between the pixel electrode 21 and the common electrode 71. In other embodiments of the present application, the orthographic projection of the pixel electrode 21 projected on the base substrate 10 covers the orthographic projection of the common electrode 71 projected on the base substrate 10, thereby maximizing a capacity of the storage capacitor. However, since the common electrode 71 has a larger area, the common electrode 71 also has high resistance. By having the auxiliary electrode 51 connected to the common electrode 71, the auxiliary electrode 51 can reduce the resistance of the common electrode 71, thereby reducing a voltage drop of the common electrode 71, and improving display effects of the display panel.

In the present application, the auxiliary electrode 51 is arranged in the second electrode layer 50 which is in a different layer from the pixel electrode 21, so that a design space of the pixel electrode 21 can be increased, and an aperture ratio of a pixel can be improved. In addition, since the design space of the pixel electrode 21 is increased, the capacity of the storage capacitor can be increased, thereby solving a problem that a conventional display panel is prone to flickering due to a small capacity of a storage capacitor.

Specifically, in a conventional array substrate, an auxiliary electrode is arranged in a same layer as a pixel electrode, so the auxiliary electrode occupies a space of the pixel electrode, resulting in a low aperture ratio of a pixel. According to the applicant's research and analysis on display panels having a same size, a longest length of a pixel electrode of sub-pixels of a conventional array substrate is 114.5 micrometers, and the technical solution of the present application can make a longest length of the pixel electrode of sub-pixels of the array substrate be increased to 120 micrometers, so the present application can effectively increase the design space of the pixel electrode and improve the aperture ratio of the pixel.

In some embodiments, the orthographic projection of the auxiliary electrode 51 projected on the base substrate 10 at least partially overlaps the orthographic projection of the pixel electrode 21 projected on the base substrate 10. The auxiliary electrode 51 and the pixel electrode 21 at least partially overlap, which also increases the capacity of the storage capacitor, thereby further reducing the flickering of the display panel.

In some embodiments, the base substrate 10 includes a pixel electrode area 11, and the auxiliary electrode 51 is located in the pixel electrode area 11. The auxiliary electrode 51 is arranged in the pixel electrode area 11, so that the pixel electrode 21 covers the auxiliary electrode 51, and an overlapping area between the pixel electrode 21 and the auxiliary electrode 51 is maximized, thereby maximizing the capacity of the storage capacitor.

Specifically, in some embodiments, the array substrate 100 further includes:
an active layer 40 disposed on the first insulating layer 30, wherein the second electrode layer 50 is disposed on the active layer 40;
wherein the first electrode layer 20 further includes a gate electrode 22, and the second electrode layer 50 further includes a source electrode 52 and a drain electrode 53. The source electrode 52 and the drain electrode 53 are connected to the active layer 40.

That is to say, the gate electrode 22 and the pixel electrode 21 are arranged in a same layer in the first electrode layer 20. The auxiliary electrode 51, the source electrode 52, and the drain electrode 53 are arranged in the same layer in the second electrode layer 50. This way, the present application has less electrode layers, thereby reducing a thickness of the display panel.

A material of the active layer 40 can be an amorphous silicon semiconductor material or a metal oxide semiconductor material. In the present embodiment, the material of the active layer 40 is the metal oxide semiconductor material. The metal oxide semiconductor material can be any one of indium gallium tin oxide semiconductor material, indium gallium zinc tin oxide semiconductor material, and indium gallium zinc oxide semiconductor material.

The present application further provides a display panel, which includes the above-mentioned array substrate 100, and further includes a color filter substrate 10 disposed opposite to the array substrate 100, and a liquid crystal layer located between the array substrate 100 and the color filter substrate 10.

Compared with conventional techniques, the display panel of the present application has the same advantages of the array substrate 100 as the above-mentioned technical solutions, and a detailed description thereof is not repeated herein.

Figure 3:
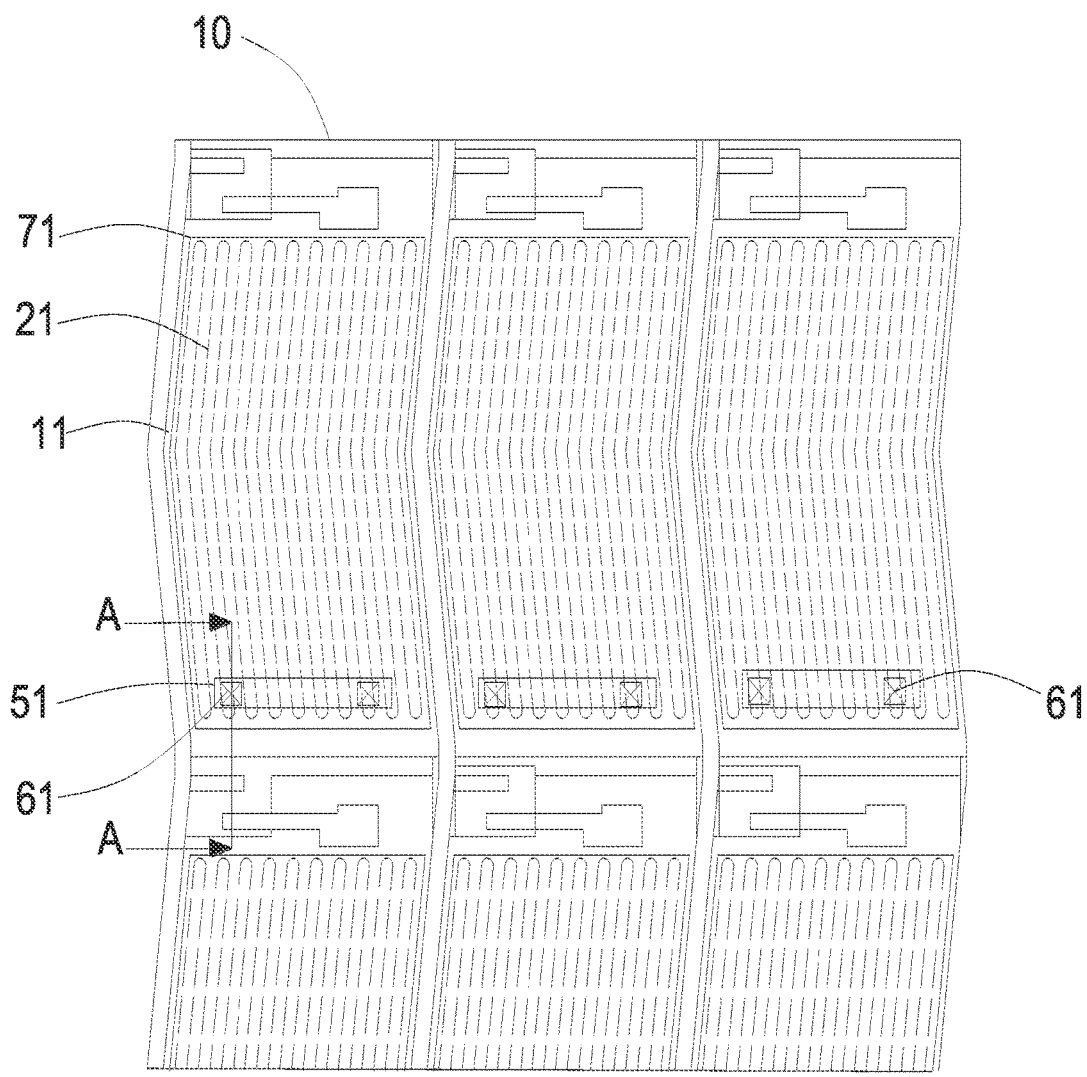
FIG. 3 is a schematic view illustrating the array substrate according to a second embodiment of the present application.

Please refer to FIG. 3, which is a schematic view illustrating the array substrate 100 according to a second embodiment of the present application. In some embodiments of the present application, at least two through holes 61 are defined in the second insulating layer 60, and the auxiliary electrode 51 is connected to the common electrode 71 through the at least two through holes 61.

By having the at least two through holes 61, the auxiliary electrode 51 is connected in parallel with the common electrode 71, thereby further reducing the resistance of the common electrode 71. Since there are multiple connection points between the auxiliary electrode 51 and the common electrode 71, the resistance distribution of the common electrode 71 is relatively uniform, so the voltage of the common electrode 71 can be relatively uniform, and the voltage fluctuation of the common electrode 71 is reduced.

Specifically, the second insulating layer 60 has two through holes 61. The two through holes 61 are a first through hole and a second through hole, respectively. One end of the auxiliary electrode 51 is connected to the common electrode 71 through the first through hole, and another end of the auxiliary electrode 51 is connected to the common electrode 71 through the second through hole.

Figure 4:
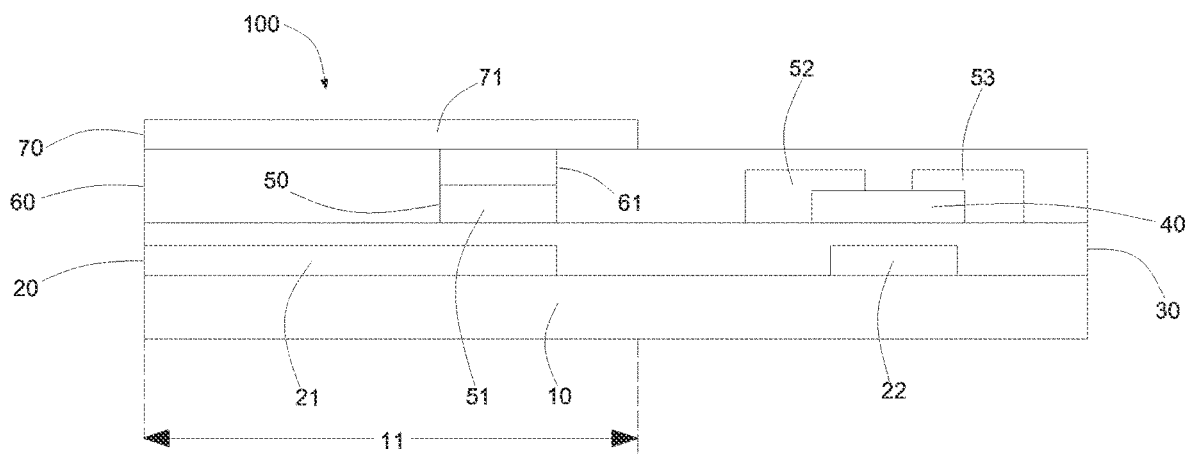
FIG. 4 is a schematic view illustrating the array substrate according to a third embodiment of the present application.

Please refer to FIG. 4, which is a schematic view of the array substrate 100 according to a third embodiment of the present application. In some embodiments of the present application, an orthographic projection of a cross-sectional profile of the through hole 61 in a thickness direction projected on the base substrate 10 covers an orthographic projection of the auxiliary electrode 51 projected on the base substrate 10.

That is to say, the through hole 61 is arranged directly above the auxiliary electrode 51, and the auxiliary electrode 51 is connected to the common electrode 71 through the through holes 61, so that the auxiliary electrode 51 and the common electrode 71 have a largest connection area, and thereby the resistance of the common electrode 71 can also be further reduced.

Figure 5:
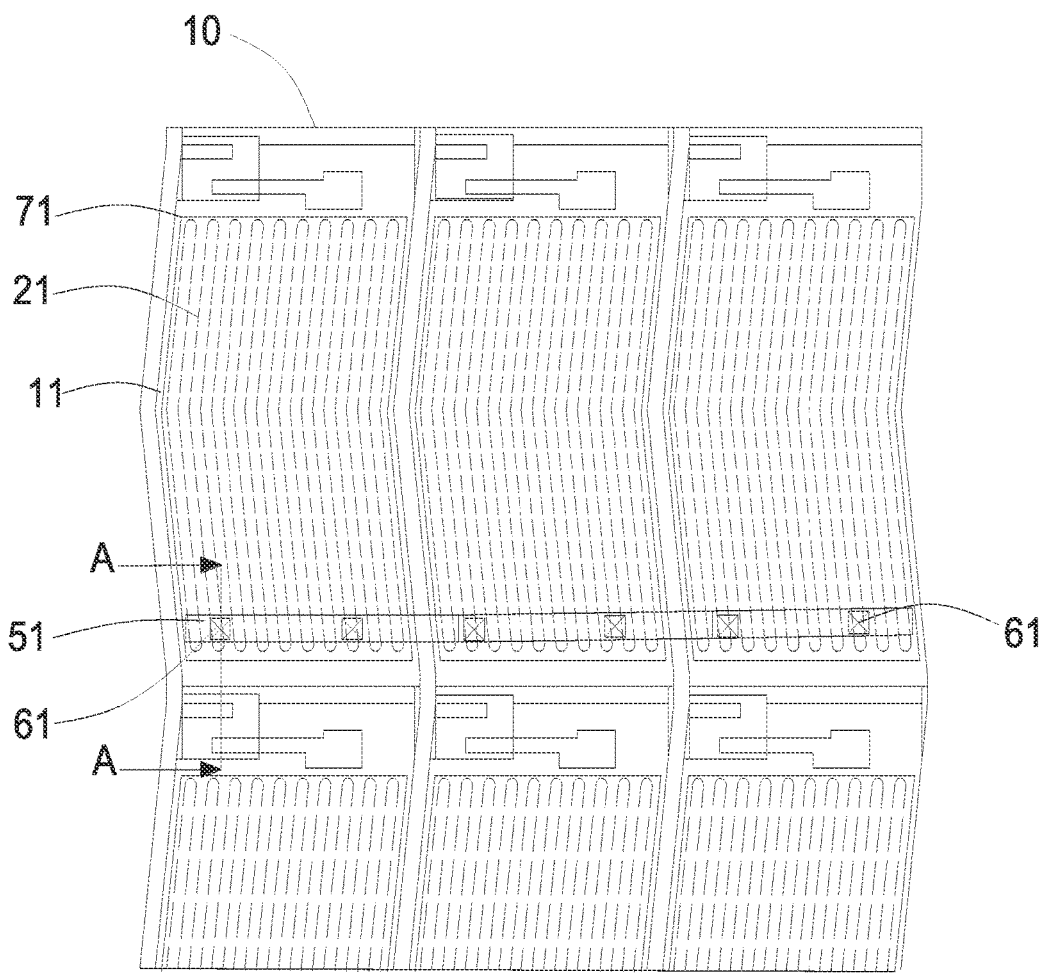
FIG. 5 is a schematic view illustrating the array substrate according to a fourth embodiment of the present application.
Figure 6:
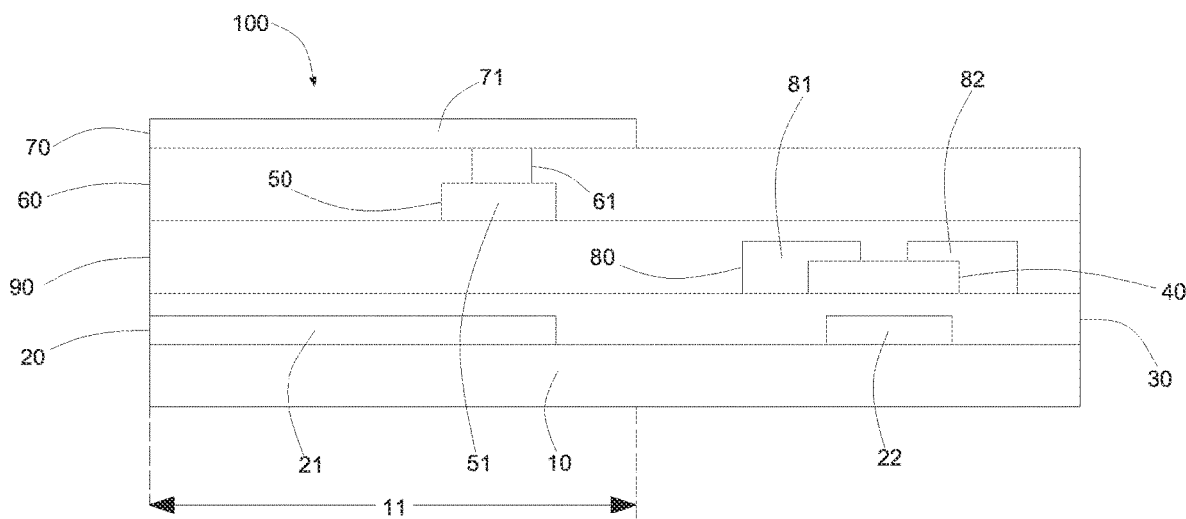
FIG. 6 is a cross-sectional view taken along line A-A in FIG. 5.

Please refer to FIG. 5. FIG. 5 is a schematic view of the array substrate 100 according to a fourth embodiment of the present application, and FIG. 6 is a cross-sectional view taken along line A-A in FIG. 5. The present embodiment is different from the array substrate 100 of FIG. 1 in that the base substrate 10 includes multiple pixel electrode areas 11, the pixel electrode areas 11 are arranged in an array, and the auxiliary electrodes 51 located in the pixel electrode areas 11 in the same row or column are connected in series.

In the present application, the auxiliary electrodes 51 located in the pixel electrode areas 11 in the same row or column are connected in series. That is to say, the auxiliary electrodes 51 are not only located in the pixel electrode areas 11, but also span between the pixel electrode areas 11, thereby increasing an area of the auxiliary electrodes 51. Since the auxiliary electrodes 51 overlap with the pixel electrodes 21, the capacity of the storage capacitor can be increased by the increase in the area of the auxiliary electrodes 51, thereby further reducing the flickering of the display panel.

In some embodiments, the second insulating layer 60 is provided with at least one through hole 61 in each of the pixel electrode areas 11. The auxiliary electrode 51 is connected to the common electrode 71 through the at least one through hole 61 in each of the pixel electrode areas 11. Since there are multiple connection points between the auxiliary electrode 51 and the common electrode 71, the resistance distribution of the common electrode 71 is more uniform, so the voltage of the common electrode 71 can be more uniform, and voltage fluctuation of the common electrode 71 can be reduced.

Specifically, the second insulating layer 60 is provided with two through holes 61 in each of the pixel electrode areas 11. The auxiliary electrode 51 is connected to the common electrode 71 through the two through holes 61.

By means of the two through holes 61, the auxiliary electrode 51 is connected in parallel with the common electrode 71 in each of the pixel electrode areas 11, thereby further reducing the resistance of the common electrode 71. Since there are multiple connection points between the auxiliary electrode 51 and the common electrode 71, the voltage of the common electrode 71 is more uniform, and the voltage fluctuation of the common electrode 71 can be reduced.

In some embodiments, the array substrate 100 further includes:
- an active layer 40 disposed on the first insulating layer 30;
- a fourth electrode layer 80 disposed on the active layer 40;
- a third insulating layer 90 disposed on the fourth electrode layer 80, wherein the second electrode layer 50 is disposed on the third insulating layer 90;
- wherein the first electrode layer 20 further includes a gate electrode 22, the fourth electrode layer 80 includes a source electrode 81 and a drain electrode 82, and the source electrode 81 and the drain electrode 82 are connected to the active layer 40.

In the present embodiment, the auxiliary electrode 51 of the present application is disposed in the second electrode layer 50. The source electrode 81 and the drain electrode 82 are disposed in the fourth electrode layer 80, and the auxiliary electrode 51 is disposed over the source electrode 81 and the drain electrode 82. That is to say, the auxiliary electrode 51 is arranged in a different layer from the source electrode 81 and the drain electrode 82. Accordingly, the auxiliary electrodes 51 can span between the pixel electrode areas 11 without contacting the source electrode 81 or the drain electrode 82, thereby preventing short-circuiting between the auxiliary electrode 51 and the source electrode 81 or the drain electrode 82.

Figure 7:
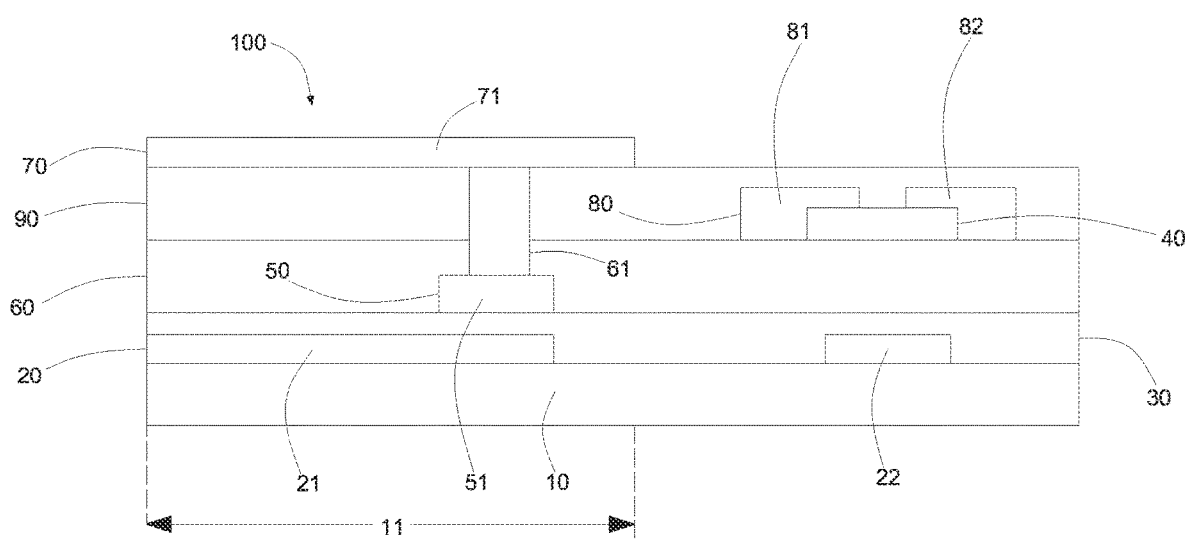
FIG. 7 is a schematic view illustrating the array substrate according to a fifth embodiment of the present application.

Please refer to FIG. 7. FIG. 7 is a schematic view of the array substrate 100 according to a fifth embodiment of the present application. The present embodiment is different from the array substrate 100 of FIG. 6 is as follows. The array substrate 100 further includes:
- an active layer 40 disposed on the second insulating layer 60;
- a fourth electrode layer 80 disposed on the second insulating layer 60;
- a third insulating layer 90 disposed on the fourth electrode layer 80, wherein the second electrode layer 50 is disposed on the third insulating layer 90;
- wherein the first electrode layer 20 further includes a gate electrode 22, the fourth electrode layer 80 includes a source electrode 81 and a drain electrode 82, the source electrode 81 and the drain electrode 82 are connected to the active layer 40, and a plurality of through holes 61 are defined in the second insulating layer 60 and the third insulating layer 90.

In the present embodiment, the auxiliary electrode 51 is disposed in the second electrode layer 50. The source electrode 81 and the drain electrode 82 are disposed in the fourth electrode layer. The auxiliary electrode 51 is disposed below the source electrode 81 and the drain electrode 82. The second insulating layer 60 and the third insulating layer are provided with the plurality of through holes 61. The common electrodes 71 are connected to the auxiliary electrodes 51 through the through holes 61 in the second insulating layer 60 and the third insulating layer. That is to say, the auxiliary electrode 51 is arranged in a different layer from the source electrode 81 and the drain electrode 82, so that the auxiliary electrode 51 can span between the pixel electrode areas 11 without contacting the source electrode 81 or the drain electrode 82, thus preventing short-circuiting between the auxiliary electrode 51 and the source electrode 81 or the drain electrode 82.

The array substrate and the display panel of the present application have been described in detail above. The working principles and embodiments of the present application are described with specific examples. The descriptions of the above embodiments are only used for ease of understanding the present application. According to the idea of this application, those skilled in the art can change and modify the specific embodiments and the application range.

What is claimed is:

1. An array substrate, comprising:
   a base substrate;
   a first electrode layer disposed on the base substrate, wherein the first electrode layer comprises a plurality of pixel electrodes and a gate electrode;
   a first insulating layer disposed on the first electrode layer;
   an active layer disposed on the first insulating layer;
   a fourth electrode layer disposed on the active layer, wherein the fourth electrode layer comprises a source electrode and a drain electrode, and the source electrode and the drain electrode are connected to the active layer;
   a third insulating layer disposed on the fourth electrode layer;
   a second electrode layer disposed on the third insulating layer, wherein the second electrode layer comprises a plurality of auxiliary electrodes;
   a second insulating layer disposed on the second electrode layer; and
   a third electrode layer disposed on the second insulating layer, wherein the third electrode layer comprises a plurality of common electrodes;
   wherein an orthographic projection of each of the pixel electrodes projected on the base substrate at least partially overlaps an orthographic projection of one of the common electrodes projected on the base substrate, a plurality of through holes are defined in the second insulating layer, and each of the auxiliary electrodes is connected to one of the common electrodes through at least one of the through holes;
   wherein the base substrate comprises a plurality of pixel electrode areas, the auxiliary electrodes are disposed in the pixel electrode areas, the pixel electrode areas are arranged in an array, and the auxiliary electrodes located in the pixel electrode areas in a same row or column are connected in series.

2. The array substrate according to claim 1, wherein an orthographic projection of each of the auxiliary electrodes projected on the base substrate at least partially overlaps an orthographic projection of one of the pixel electrodes projected on the base substrate.

3. The array substrate according to claim 1, wherein each of the auxiliary electrodes is connected to one of the common electrodes through at least two of the through holes.

4. The array substrate according to claim 1, wherein an orthographic projection of a cross-sectional profile of each of the through holes in a thickness direction projected on the base substrate covers an orthographic projection of one of the auxiliary electrodes projected on the base substrate.

5. The array substrate according to claim 1, further comprising:
an active layer disposed on the second insulating layer;
a fourth electrode layer disposed on the second insulating layer; and
a third insulating layer disposed on the fourth electrode layer, wherein the second electrode layer is disposed on the third insulating layer;
wherein the first electrode layer further comprises a gate electrode, the fourth electrode layer comprises a source electrode and a drain electrode, the source electrode and the drain electrode are connected to the active layer, and the plurality of through holes are defined in the second insulating layer and the third insulating layer.

6. The array substrate according to claim 1, wherein an orthographic projection of each of the pixel electrodes projected on the base substrate covers an orthographic projection of one of the common electrodes projected on the base substrate.

7. A display panel, comprising:
an array substrate, a color filter substrate disposed opposite to the array substrate, and a liquid crystal layer located between the array substrate and the color filter substrate, wherein the array substrate comprises:
a base substrate;
a first electrode layer disposed on the base substrate, wherein the first electrode layer comprises a plurality of pixel electrodes and a gate electrode;
a first insulating layer disposed on the first electrode layer;
an active layer disposed on the first insulating layer;
a fourth electrode layer disposed on the active layer, wherein the fourth electrode layer comprises a source electrode and a drain electrode, and the source electrode and the drain electrode are connected to the active layer;
a third insulating layer disposed on the fourth electrode layer;
a second electrode layer disposed on the third insulating layer, wherein the second electrode layer comprises a plurality of auxiliary electrodes;
a second insulating layer disposed on the second electrode layer; and
a third electrode layer disposed on the second insulating layer, wherein the third electrode layer comprises a plurality of common electrodes;
wherein an orthographic projection of each of the pixel electrodes projected on the base substrate at least partially overlaps an orthographic projection of one of the common electrodes projected on the base substrate, a plurality of through holes are defined in the second insulating layer, and each of the auxiliary electrodes is connected to one of the common electrodes through at least one of the through holes,
wherein the base substrate comprises a plurality of pixel electrode areas, the auxiliary electrodes are disposed in the pixel electrode areas, the pixel electrode areas are arranged in an array, and the auxiliary electrodes located in the pixel electrode areas in a same row or column are connected in series.

8. The display panel according to claim 7, wherein an orthographic projection of each of the auxiliary electrodes projected on the base substrate at least partially overlaps an orthographic projection of one of the pixel electrodes projected on the base substrate.

9. The display panel according to claim 7, wherein each of the auxiliary electrodes is connected to one of the common electrodes through at least two of the through holes.

10. The display panel according to claim 7, wherein an orthographic projection of a cross-sectional profile of each of the through holes in a thickness direction projected on base the substrate covers an orthographic projection of one of the auxiliary electrodes projected on the base substrate.

11. The display panel according to claim 7, wherein the array substrate further comprises:
an active layer disposed on the second insulating layer;
a fourth electrode layer disposed on the second insulating layer; and
a third insulating layer disposed on the fourth electrode layer, wherein the second electrode layer is disposed on the third insulating layer;
wherein the first electrode layer further comprises a gate electrode, the fourth electrode layer comprises a source electrode and a drain electrode, the source electrode and the drain electrode are connected to the active layer, and the plurality of through holes are defined in the second insulating layer and the third insulating layer.

12. The display panel according to claim 7, wherein an orthographic projection of each of the pixel electrodes projected on the base substrate covers an orthographic projection of one of the common electrodes projected on the base substrate.

* * * * *